United States Patent [19]
Goel et al.

[11] Patent Number: 5,838,023
[45] Date of Patent: Nov. 17, 1998

[54] ANCILLARY PADS FOR ON-CIRCUIT ARRAY PROBING COMPOSED OF I/O AND TEST PADS

[75] Inventors: Atul Goel; Yaw-Hwang Chen, both of Fort Collins; John R. Spencer, Loveland, all of Colo.

[73] Assignee: Hewlett-Packard Company, Palo Alto, Calif.

[21] Appl. No.: 920,337

[22] Filed: Aug. 27, 1997

Related U.S. Application Data

[63] Continuation of Ser. No. 524,598, Sep. 7, 1995, abandoned.
[51] Int. Cl.⁶ .................................................. H01L 29/40
[52] U.S. Cl. ........................ 257/48; 257/503; 257/673; 257/700; 257/758; 257/778; 257/781; 438/406; 438/453; 438/593; 438/622
[58] Field of Search .............................. 257/48, 382, 383, 257/700, 758–760, 690, 503, 508, 698, 774, 781, 182, 211, 735–737, 778, 673; 438/11, 18, 612, 406, 453, 592, 622

[56] References Cited

U.S. PATENT DOCUMENTS

| | | | |
|---|---|---|---|
| 4,249,193 | 2/1981 | Balyoz et al. ............................ | 257/48 |
| 5,239,191 | 8/1993 | Sakumoto et al. ....................... | 257/203 |
| 5,250,841 | 10/1993 | Sloan et al. ............................... | 257/666 |
| 5,394,013 | 2/1995 | Oku et al. ................................. | 257/758 |
| 5,536,584 | 7/1996 | Sotokawa et al. ....................... | 428/458 |

FOREIGN PATENT DOCUMENTS

| | | | |
|---|---|---|---|
| 6061298 | 3/1994 | Japan ....................................... | 257/48 |

OTHER PUBLICATIONS

IBM Tech. Disclosure Bulletin, vol. 13 No. 7 Dec. 1970 D.E. Shults.

*Primary Examiner*—Tom Thomas
*Assistant Examiner*—Fetsum Abraham
*Attorney, Agent, or Firm*—Cynthia S. Baan

[57] ABSTRACT

An integrated circuit device is provided that has I/O bonding pads across the surface of the chip, where the I/O bonding pads can be electrically accessed via ancillary testing pads in order to perform functionality or other necessary tests prior to bump bonding formation without damaging the bonding pads or the underlying circuitry.

2 Claims, 2 Drawing Sheets

ANCILLARY PADS FOR ON-CIRCUIT ARRAY PROBING COMPOSED OF I/O AND TEST PADS

CROSS REFERENCE TO RELATED APPLICATION

This is a continuation of application Ser. No. 08/524,598 filed on Sep. 7, 1995, now abandoned.

FIELD OF THE INVENTION

The present invention relates generally to the field of integrated circuit devices and more particularly to on-circuit testing of integrated circuit chip.

BACKGROUND OF THE INVENTION

As more and more transistors and circuitry are put onto a single integrated circuit chip, integrated circuit manufacturers have found it necessary to move I/O bonding pads into the middle of the chip, as opposed to merely utilizing the outer periphery of the chip for the I/O bonding pads. This situation has arisen because there is not enough periphery area for all of the bonding pads of high density integrated circuits. Also, routing out to bonding pads on the periphery causes delay and line resistance problems, not to mention the valuable silicon area eaten up by the routing of 500–1000 or more bonding pads out to the periphery. Layout for chips with periphery bonding pads is generally driven, among other things, by delay critical circuit elements, such as the clock, having to be placed as close to the periphery as possible in order to minimize delay issues.

A typical integrated circuit chip today with more than a few hundred I/O will generally have bonding pads across the surface of the chip. Flip chips generally have bonding pads across the surface of the chips. Bonding pads across the surface of the chip minimize or eliminate line delay, resistance and noise issues, as bonding pads are generally above or in very close proximity to the corresponding I/O circuit element.

As integrated circuits (ICs) become more and more complicated, testing also becomes more complex. Generally, ICs may be tested at the die level, the package level and the board level. During the semiconductor manufacturing process, it is advantageous to detect defective integrated circuits as early as possible, in order to prevent unnecessary (and costly) manufacturing steps. Accordingly, testing at the die level, usually while the chip are still in wafer form, is very important from a manufacturing cost perspective. However, die level testing problems arise for ICs that have bonding pads across the surface of the chip, as test access is generally gained via test probes being brought into physical and electrical contact with the bonding pads.

Some of the testing problems that typically result with bonding pads across the surface of the IC chip include the test pins damaging the bonding pads so that a bump bond will not adequately form on the bonding pads or the pressure of the test pins making contact with the bonding pads may damage underlying circuitry. Many IC manufacturers have addressed these problems by performing die level testing after the bump bonds have been formed on the chip, which allows the bump bond to make contact with the test pin and absorb the pressure therefrom. The bump bonds are then reflowed in order to repair any damage from the test pins making pressure contact with the bump bonds. However, this is a relatively expensive solution as the step of bump bonding is expensive if a chip has 500–1000 or more bonding pads to be bumped. Moreover, performing bump bonding on a significant number of bad chips, each of which has 500–1000 or more bonding pads, wastes manufacturing resources. This approach also adds an additional manufacturing step of reflowing the bump bonds to repair the damage caused by the test pins.

Another solution that IC manufacturers have used to address the above problems is to provide an on chip test circuit with dedicated test pads that do not need to later have bump bonds formed thereon, or to route a few test pads to a particular area on the chip—often the periphery. This is also not a satisfactory solution, as these tests are generally very minimal tests. To justify the expense of going from die at wafer level to packaged chips, manufacturers would ideally like to know whether a chip is fully functioning.

Accordingly, it would be desirable to solve the above problems by providing an IC chip that can be tested for defects prior to bump bonding without causing any significant damage to the bonding pads or the circuitry under the bonding pads.

SUMMARY OF THE INVENTION

It is an aspect of the present invention to provide an IC chip that has bonding pads across the surface of the chip, where the chip can be tested prior to bump bonding without the bonding pads being significantly damaged by the test pins.

It is another aspect of the present invention to provide an IC chip that has bonding pads across the surface of the chip, where the chip can be tested prior to bump bonding without the circuitry under the bonding pads being significantly damaged by the pressure of the test pins contacting the bonding pads.

The above and other aspects of the present invention are accomplished with an integrated circuit chip that has bonding pads across the surface of the chip, where any bonding pads that need to be accessed in order to fully test the chip have an ancillary test pad electrically connected thereto.

BRIEF DESCRIPTION OF THE DRAWINGS

The above and other objects, features and advantages of the present invention will be better understood by reading the following more particular description of the invention, presented in conjunction with the following drawings, wherein.

DETAILED DESCRIPTION OF THE PREFERRED EMBODIMENT

Figure 1:
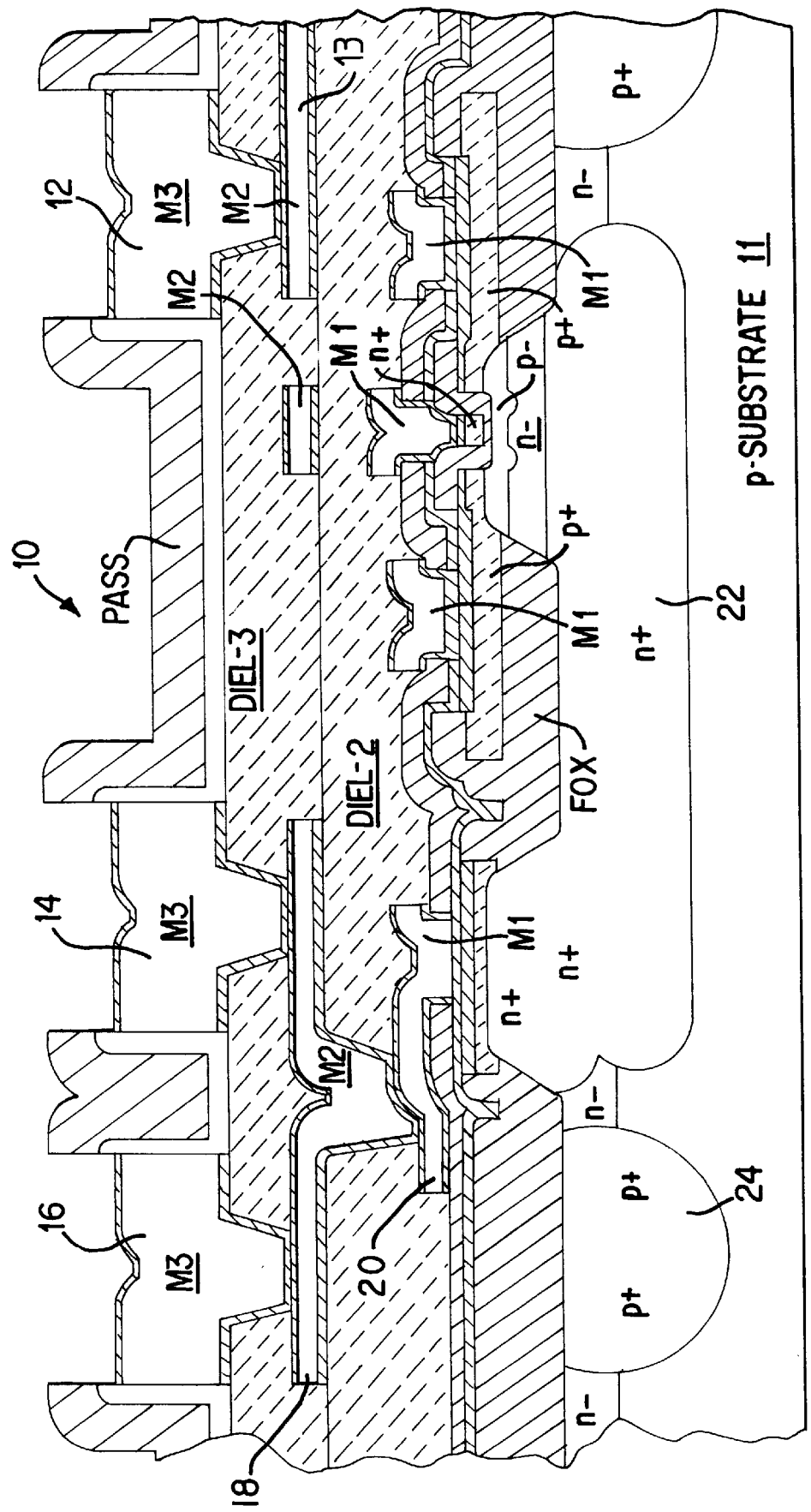
FIG. 1 shows a cross-sectional, cut-away view of a portion of an integrated circuit device according to a first embodiment of the present invention.

FIG. 1 shows cross-sectional, cut-away view of a portion of an integrated circuit device according to a first embodiment of the present invention. FIG. 1 is an integrated circuit device with three layers of metalization M1, M2, and M3. Bonding pad 14 is connected to the collector of transistor 22 through second level metalization 18 and first level metalization 20. Although it is advantageous to have bonding pad 14 in as close physical proximity to the collector of transistor 22 as possible, it is not advantageous to use bonding pad 14 for testing purposes, as the inventor(s) have found that test pins tend to damage bonding pads to such an extent that the bonding pads are unable to maintain a bond with a bump bond thereafter. Moreover, the inventor(s) have found that in integrated circuit devices with three or fewer metalization layers, the pressure resulting from preforming tests above certain circuit elements (e.g., thin gate oxides and thin metalization lines) tends to cause damage to the underlying circuit (e.g., shorts). Accordingly, the inventor(s) have discovered that routing the collector connection to a test pad 16 that is not overlying any critical circuit elements solves this problem.

Specifically, test pad 16 is electrically equivalent to bonding pad 14, as both pads are electrically connected to the collector of transistor 22. However, test pad 16 is overlying an isolation region 24, which is in substantially no danger of being damaged from the downward force of a test pin coming into contact with test pad 16. Accordingly, it is possible to route bonding pads across the surface of the integrated circuit device 10 so that the routing lines have as little delay, resistance, and noise as possible between the circuit I/O elements and the corresponding bonding pad(s). And at the same time, any circuit I/O elements that need to be functionally tested can have a ancillary test pad connected thereto and routed to a place on the surface of the integrated circuit device that is not overlying any circuit elements that can potentially be damaged from the pressured caused by the test pins coming into contact with the test pad.

This has a three fold advantage of (1) saving underlying circuitry from potential damage caused by the downward forces of testing pins, (2) saving the bonding pads from being damaged by the testing pins, (3) and permitting the bonding pads to be in as close proximity to the corresponding circuit element as possible in order to minimize line delay, resistance and noise. It may also simplify metalization routing, since 500–1000 or more bonding pads do not have to be routed from their respective positions across the surface of the chip to the periphery of the chip. It should also be noted that even though test pad 16 is shown in close proximity to bonding pad 14, this is not necessary, test pad 16 could be routed to another location if the area around bonding pad 14 is crowded by other bonding or test pads, or if this underlying area is crowded with circuit elements that have a high probability of being damaged by the pressure of a test pin coming into contact with a test pad. Test pad 16 could be routed to virtually any location on the surface of the chip, even a periphery location. Since test pad 16 is for testing, and test pad 16 is not critical to circuit performance, it is not critical that test pad 16 be in as close proximity to the corresponding circuit element as it is for bonding pad 14 to be in as close proximity to the corresponding circuit element (collector or transistor 22) as possible.

It should also be noted that bonding pad 12 would be a bonding pad for another circuit element (not shown). Pad 12 would probably not be a test pad as it is overlying the base of transistor 22. If the circuit element to which bonding pad 12 corresponds is to be tested during die level testing, than an ancillary testing pad (not shown) would be routed to an area on the surface of the integrated circuit chip such that the test pad would not be overlying any circuit element that could potentially be damaged from the pressure of the test pin on the test pad during die level testing.

It should also be noted that although FIG. 1 shows the routing out to the test pad 16 occurring at the second metalization layer 18, it could also have occurred at the first metalization layer 20. This would be a matter of routing and layout design choice.

Figure 2:
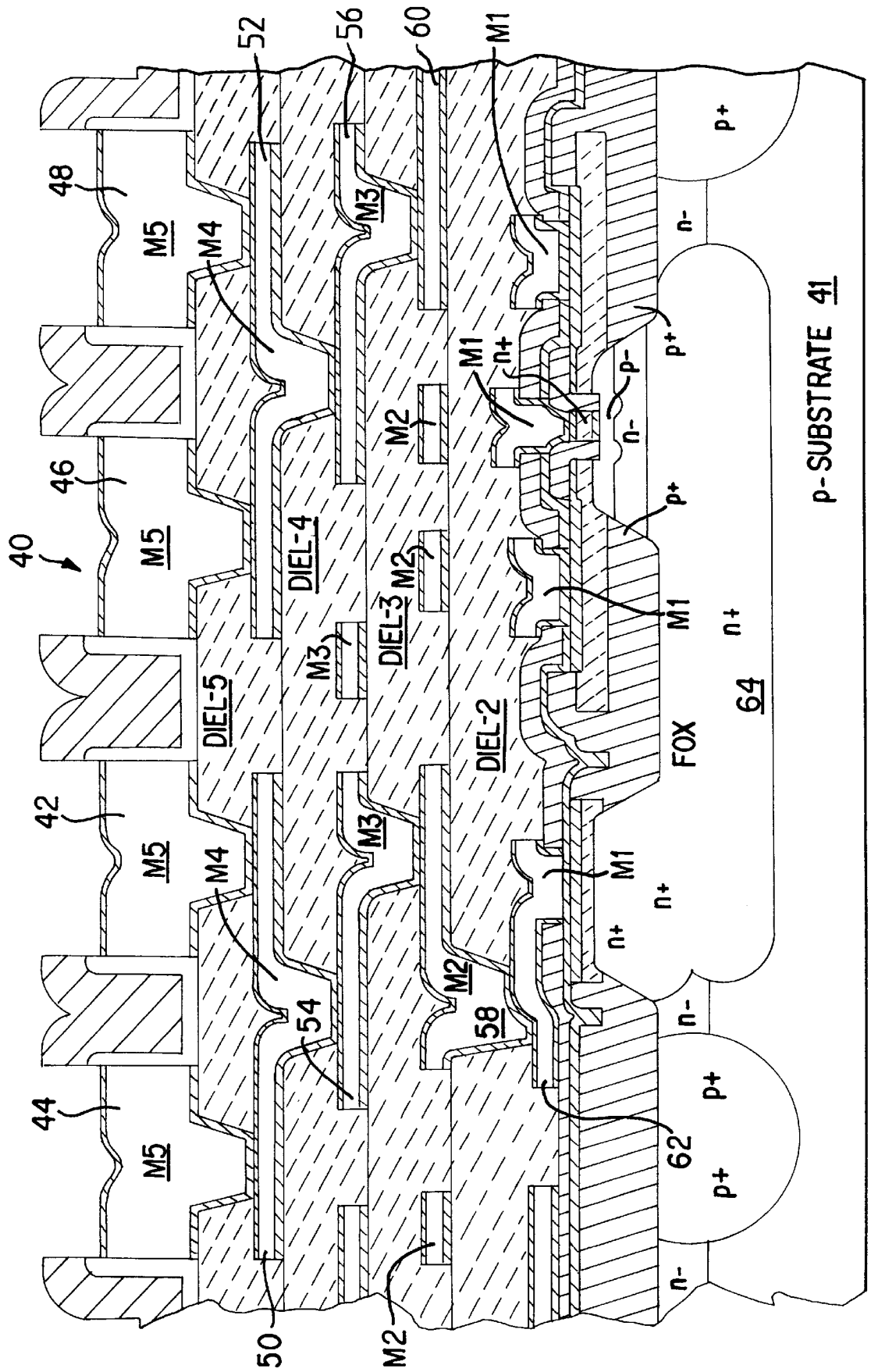
FIG. 2 shows a cross-sectional, cut-away view of a portion of an integrated circuit device according to a second embodiment of the present invention.

FIG. 2 shows cross-sectional, cut-away view of a portion of an integrated circuit device according to a second embodiment of the present invention. FIG. 2 is an integrated circuit device with five layers of metalization M1, M2, M3, M4, and M5. Bonding pad 42 is connected to the collector of transistor 64 through fourth level metalization 50, third metalization layer 54, second metalization layer 58, and first level metalization 62. Although it is advantageous to route bonding pad 42 in as close proximity as possible to the corresponding circuit element (the collector of transistor 64), it is not advantageous to use bonding pad 42 as a testing pad, as the pressure of the test pin on the bonding pad tends to damage the bonding pad to such an extent that the bonding pad is unable to form an adequate bump bond thereafter.

Accordingly, the inventor(s) have discovered that electrically connecting an ancillary test pad 44 to the bonding pad 42 or the corresponding circuit element (the collector of transistor 64) solves the above problem. The inventor(s) have further discovered that in an integrated circuit device with five or more layers of metalization, there is no need to route the ancillary test pad 44 to an area of the chip that does not overly any critical elements, because underlying circuit elements are generally not damaged by the pressure of test pins coming into contact with the test pad 44. It is believed that this phenomenon is due to the hardness of the dielectric layers (DIEL-1, DIEL-2, DIEL-3, DIEL-4, and DIEL-5) and the relative softness of the metalization layers (M1, M2, M3, M4, and M5) act as a sandwich type shock absorber for the pressure of the test pins coming into contact with the test pads. Accordingly, the placement of test pad 44 is governed by routing/layout design preference, rather than by trying to avoid specific underlying circuit elements.

It should be noted that bonding pad 42 and test pad 44 were labeled randomly, thus, 42 could have been selected as the test pad, which means the test pad would be directly over the collector region of transistor 64. Most likely, during routing/layout, the location that was in closer physical proximity to the corresponding circuit element would be chosen as the bonding pad. Although, there are a few routing/layout consideration that could change this choice. For example, although not shown in the Figures, a bonding pad is approximately half of the size of test pad in order to compensate for the geometries and error of the test pins making contact with the test pad. There are also routing/layout rules as to how close a bonding pad can be to certain other elements in layout in order to avoid shorts. However, regardless of whether pad 42 or pad 44 is selected as the bonding or the test pad, it should be noted that other than having all bonding pads as close as possible to their corresponding circuit elements, the position of the test pad is not dependent on the underlying circuit elements.

It should also be noted that although test pad 44 is connected to bonding pad 42 and the collector of transistor 64 by means of the fourth metalization layer being routed to accomodate it, ancillary test pad 44 could also be connected by means of the third metalization layer, the second metalization layer or the first metalization layer being routed out to accomodate it. This would be a routing/layout design preference.

Pads 46 and 48 connected to another circuit I/O element (not shown) by means of fourth metalization layer 52, third metalization layer 56, second metalization layer 60, and first metalization layer (not shown). Whichever of pads 46 and 48 is considered to be closer to the corresponding circuit element (not shown) would most likely be the bonding pad and the other would probably be the test pad. However, it should be noted that both pads are overlying the base and emitter regions of transistor 64. Again, it is not important which pad 46 or 48 is the test pad, as the five dielectric layers (DIEL-1, DIEL-2, DIEL-3, DIEL-4, and DIEL-5) and the five layers of metalization (M1, M2, M3, M4, and M5) act as a sandwich type shock absorber for the pressure of a test pin coming into contact with a test pad. The dielectric layers can be any known dielectric material, such as silicon dioxide, silicon nitride, etc. The five layers of metalization can be any known metalization material, such as copper, aluminum, titanium, etc., or a sandwiched combination of any known metalization materials.

It should also be noted that although FIG. 2 shows the test pads in close proximity to the corresponding bonding pads, this is not necessary. Although a particular bonding pad should generally be as close as the routing/layout rules will allow to the corresponding circuit element in order to minimize line delay, resistance, noise, etc., for testing purposes, these are generally not issues. Accordingly, a test pad will probably be routed to whatever location is expedient to the routing/layout of the overall integrated circuit device. The test pads may even be routed to the periphery of the chip.

Accordingly, two embodiments have been shown for an integrated circuit device that has ancillary test pads that permit die/wafer level testing prior to bump bonding without causing damage to either the bonding pads themselves or the underlying circuit elements. The first embodiment is for integrated circuit devices with four or fewer metalization layers. Although it could certainly be used for more than four metalization layers, it would not be feasible in such a complicated device as one that requires more than four metalization layers to route all test pads to a "safe" area of the chip. The second embodiment is for integrated circuit devices with five or more metalization layers, where the metalization and dielectric layers act a shock absorber for the pressure of the test pins coming into contact with the test pads, and so, routing the test pads to a "safe" area of the chip is unnecessary.

The foregoing description of the present invention has been presented for purposes of illustration and description. It is not intended to be exhaustive or to limit the invention to the precise form disclosed, and other modifications and variations may be possible in light of the above teachings. For example, as stated earlier, the test pads do not necessarily need to be in close proximity to the bonding pads and can be routed to a location on the integrated circuit chip as routing/layout design preferences find expedient. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit device comprising:

an integrated circuit main body, said integrated circuit main body having a first surface and a second surface, said integrated circuit main body having a multitude of circuit elements formed in a first surface thereof;

more than one I/O contact area formed on various of said multitude of circuit elements on said first surface of said integrated circuit main body, said more than one I/O contact area permitting electrical contact between said multitude of circuit elements and with electrical devices external to said integrated circuit device;

more than one layer of metalization, said more than one layer of metalization being formed on said first surface of said integrated circuit main body in contact with various of said more than one I/O contact areas and forming a network of metalization between and among said multitude of circuit elements, such that said multitude of circuit elements are electrically connected to form a predetermined circuit, said more than one layer of metalization being insulated from each other by more than one layer of dielectric material, except at predetermined routing locations between said more than one layer of metalization, said predetermined routing locations providing electrical contact through said more than one layer of dielectric material between said more than one layer of metalization, said predetermined routing locations between said more than one layer of metalization forming an network of metalization for connecting said multitude of circuit elements to electrical devices external to said integrated circuit device;

more than one bonding pad formed on an upper layer of said more than one layer of metalization at predetermined locations across a top surface of said integrated circuit main body, each of said more than one bonding pads being in electrical connection with one of said more than one I/O contact areas of said various circuit elements, such that each of said more than one bonding pads is in close proximity to the corresponding circuit element that it is electrically connected to; and more than one test pad formed on said upper layer of said more than one layer of metalization at predetermined locations across a top surface of said integrated circuit main body, each of said more than one test pads being in electrical contact with one of said more than one bonding pads, each of than more than one test pads is positioned in such a manner as to not layover any dicing areas, circuit element or metalization line that can be damaged when test pins are brought into pressure contact with each of said more than one test pad.

2. An integrated circuit device comprising:

an integrated circuit main body, said integrated circuit main body having a first surface and a second surface, said integrated circuit main body having a multitude of circuit elements formed in a first surface thereof;

more than one I/O contact area formed on various of said multitude of circuit elements on said first surface of said integrated circuit main body, said more than one I/O contact area permitting electrical contact between said multitude of circuit elements and with electrical devices external to said integrated circuit device;

five or more layers of metalization, said five of more layers of metalizatin being formed on said first surface of said integrated circuit main body in contact with various of said more than one I/O contact areas and forming a network of metalization between and among said multitude of circuit elements, such that said multitude of circuit elements are electrically connected to form a predetermined circuit, said five or more layers of metalization being insulated from each other by five or more layers of dielectric material, except at predetermined routing locations providing electrical contact through said five or more layers of dielectric material between said five or more layers of metalization, said predetermined routing locations between said five or more layers of metalization forming a network of metalization for connecting said multitude of circuit elements to electrical devices external to said integrated circuit device;

more than one bonding pad formed on an upper layer of said five or more layers of metalization at predetermined locations across a top surface of said integrated circuit main body, each of said more than one bonding pads being in electrical connection with one or said more than one I/O contact areas of said various circuit elements, such that each of said more than one bonding pad is in close proximity to the corresponding circuit element that it is electrically connected to; and more than one test pad formed on said upper layer of said five or more layers of metalization at predetermined locations across a top surface of said integrated circuit main body, each of said more than one test pad being in electrical contact with one of said more than one bonding pads, each of said more than one test pad not being positioned over a dicing area.

* * * * *